(12) United States Patent
Amourah (10) Patent No.: US 8,760,203 B1
(45) Date of Patent: Jun. 24, 2014

(54) OTA BASED FAST LOCK PLL

(71) Applicant: Cypress Semiconductor Corporation, San Jose, CA (US)

(72) Inventor: Mezyad Amourah, Milpitas, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/040,525

(22) Filed: Sep. 27, 2013

Related U.S. Application Data (60) Provisional application No. 61/817,975, filed on May 1, 2013.

(51) Int. Cl.
*H03L 7/06* (2006.01)
*H03L 7/08* (2006.01)

(52) U.S. Cl.
CPC .................................... *H03L 7/08* (2013.01)
USPC .......................................... 327/157; 327/148

(58) Field of Classification Search
USPC ................................................ 327/148, 157
See application file for complete search history.

(56) References Cited

U.S. PATENT DOCUMENTS

| | | | |
|---|---|---|---|
| 4,053,933 A | | 10/1977 | Collins |
| 4,164,926 A | * | 8/1979 | Kindlmann ............... 123/406.59 |
| 5,945,855 A | * | 8/1999 | Momtaz ........................ 327/157 |
| 6,005,444 A | | 12/1999 | Carpelan |
| 6,326,852 B1 | * | 12/2001 | Wakayama ..................... 331/17 |
| 6,618,296 B2 | | 9/2003 | Zhang |
| 6,762,634 B1 | * | 7/2004 | Hattori .......................... 327/159 |
| 7,026,879 B2 | | 4/2006 | Booth |
| 7,030,688 B2 | * | 4/2006 | Dosho et al. .................. 327/558 |
| 7,057,465 B2 | * | 6/2006 | Wakayama ..................... 331/16 |
| 7,081,781 B2 | | 7/2006 | Zhu et al. |
| 7,187,242 B2 | | 3/2007 | Karlsson |
| 7,446,595 B2 | | 11/2008 | Lee et al. |
| 8,456,204 B2 | * | 6/2013 | Mika et al. .................... 327/156 |
| 2003/0007585 A1 | * | 1/2003 | Dalton et al. ................. 375/376 |
| 2004/0232999 A1 | * | 11/2004 | Kim ................................ 331/17 |
| 2005/0219001 A1 | * | 10/2005 | Booth ............................. 331/17 |
| 2008/0178129 A1 | * | 7/2008 | Ehrenreich ...................... 716/4 |
| 2008/0265959 A1 | * | 10/2008 | Kimura ......................... 327/156 |
| 2009/0066446 A1 | * | 3/2009 | Sahu et al. .................... 333/172 |
| 2009/0153219 A1 | * | 6/2009 | Wu et al. ....................... 327/333 |
| 2011/0187425 A1 | * | 8/2011 | Mika et al. .................... 327/157 |
| 2011/0215869 A1 | * | 9/2011 | Abbasi et al. ................. 330/253 |
| 2012/0126866 A1 | * | 5/2012 | Hsieh et al. ................... 327/157 |
| 2012/0200327 A1 | * | 8/2012 | Sreekiran et al. ............. 327/157 |
| 2012/0319786 A1 | * | 12/2012 | Kumar et al. ............... 331/1 R |
| 2013/0154695 A1 | * | 6/2013 | Abbasi et al. ................. 327/157 |

FOREIGN PATENT DOCUMENTS

| | | |
|---|---|---|
| EP | 2855341 A1 | 11/2004 |
| GB | 2415102 A | 12/2005 |

OTHER PUBLICATIONS

Search Report for "An OTA Based Fast Lock PLL" Aug. 2013, 4 pages.

Woo, K. et al. "Fast-Lock Hybrid PLL Combining Fractional-N and Integer-N Modes of Differing Bandwidths" IEEE Journal of Solid-State Circuits, vol. 43, No. 2, Feb. 2008, 11 pages.

(Continued)

*Primary Examiner* — Adam Houston (57) ABSTRACT

A charge pump, comprising a charge pump output may be operatively coupled to a filter input of a loop filter. A first amplifier input of an operational transconductance amplifier (OTA) may be operatively coupled to the filter input and the charge pump output, and the second amplifier input is operatively coupled to the amplifier output and filter output.

10 Claims, 5 Drawing Sheets

(56) References Cited

OTHER PUBLICATIONS

Bashir A. et al. "Fast Lock Scheme for Phase-Locked Loops" IEEE 2009 Custom Integrated Circuits Conference (CICC) Intel Corporation, 4 pages.

Yan, X. et al. "A Smart Frequency Presetting Technique for Fast Lock-in LC-PLL Frequency Synthesizer" Institute of Semiconductors, Chinese Academy of Sciences, 2009, 4 pages.

Fox, Adrian "Ask the Applications Engineer—30: PLL Synthesizers" Analog Dialogue vol. 36, Issue 3, 2002, 4 pages.

\* cited by examiner

OTA BASED FAST LOCK PLL

RELATED APPLICATIONS

This application claims the benefit of U.S. Provisional Patent Application No. 61/817,975, filed on May 1, 2013, which is hereby incorporated herein by reference in its entirety.

TECHNICAL FIELD

This disclosure relates to the field of electric circuits and, in particular, to phase-locked loop circuits.

BACKGROUND

Phase-locked loops (PLLs) generate signals relative to a reference signal. A PLL adjusts a frequency of a PLL output signal based on differences in phase and/or frequency of the reference signal and the output signal. The frequency of the output signal is increased or decreased based on the difference. The phase-locked loop is, therefore, a control system using negative feedback. PLLs are used in a multitude of electronic devices such as SRAM, data communication channels, and System-on-Chips (SOCs).

PLL lock time is generally long. Analog PLLs use large filter capacitors and small charge pump currents which contribute to long lock times. In order to decrease lock time, designers have pre-charged the main low pass filter capacitor, increased the charge pump current, enabled an additional charge pump circuit, and increased the PLL bandwidth (BW). Such methods are often unsuitable because of associated increase in cost and/or degradation in performance.

BRIEF DESCRIPTION OF THE DRAWINGS

The present disclosure will be understood more fully from the detailed description given below and from the accompanying drawings of various embodiments of the present disclosure, which, however, should not be taken to limit the present disclosure to the specific embodiments, but are for explanation and understanding only.

DETAILED DESCRIPTION

In the following description, for purposes of explanation, numerous specific details are set forth in order to provide a thorough understanding of the present disclosure. It will be evident, however, to one skilled in the art that the present disclosure may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the disclosure. The phrase "in one embodiment" located in various places in this description does not necessarily refer to the same embodiment.

Embodiments of a method and apparatus of the present disclosure describe a PLL thereof including a charge pump, loop filter, and operational transconductance amplifier to reduce the lock time of the PLL. PLL lock time is generally long. Analog PLLs use large filter capacitors and small charge pump currents, contributing to long lock times. Often, the lock times of PLLs are in the order of tens of micro seconds. PLLs are used in a multitude of electronic circuits that include but are not limited to SRAM, System-on-Chips (SOCs), and data communication channels.

PLL lock time is dependent on PLL loop Bandwidth (BW) or PLL natural frequency ($\omega_n$). A PLL's natural frequency ($\omega_n$) equation is as follows:

$$\omega_n^2 = \frac{I_{CP} K_{VCO}}{2\pi N (C_Z + C_P)} \qquad \text{[Equation 1]}$$

A PLL's natural frequency ($\omega_n$) equation suggests that a PLL's lock time is proportional to the update rate (1/N), charge pump current ($I_{CP}$), and inversely proportional to loop filter caps sizes $C_Z$ and $C_P$. A PLL block diagram is shown in FIG. 1.

Some embodiments of PLLs have charge pump currents in the order of tens of micro-amps while loop filter capacitance sizes are in the hundreds of pico-farads. PLL lock time is lengthened mainly by the time required to charge the PLL loop filter main capacitor, for example, filter capacitor 237 in FIG. 2, to the required voltage controlled oscillator (VCO) control voltage.

In one embodiment, an operational transconductance amplifier (OTA) is used as a continuous time, variable current source that works in parallel with a charge pump in a PLL. The OTA helps charge the PLL loop filer main capacitor. As the capacitor is charged to the nominal value the OTA current decreases down to near zero.

Figure 1:
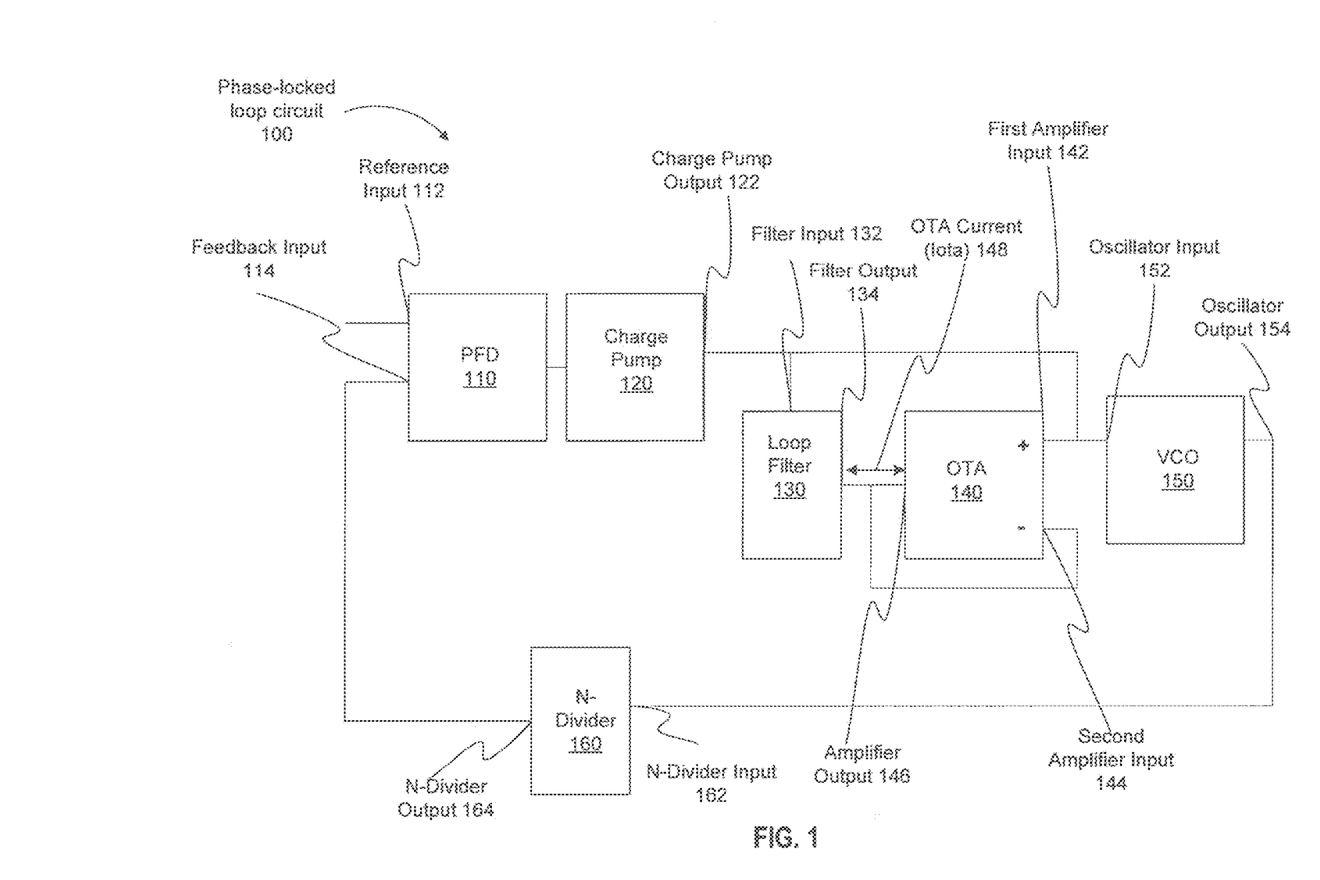
FIG. 1 is a block diagram illustrating one embodiment of a phase-locked loop (PLL) including an operational transconductance amplifier (OTA).

FIG. 1 is a block diagram illustrating one embodiment of a PLL including an operational transconductance amplifier (OTA). In this embodiment, PLL 100 includes OTA 140. The first amplifier input 142 of OTA 140 is coupled to the charge pump output 122, the filter input 132 of the loop filter 130, and the oscillator input 152 of the VCO 150. The second amplifier input 144 of OTA 140 is coupled in a feedback loop with the amplifier output 146 and also connected to the filter output 134 of loop filter 130. Phase-frequency detector (PFD) 110 is coupled to charge pump 120. The feedback loop of PLL 100 is completed by coupling the oscillator output 154 of VCO 150 to N-divider circuit 160 and finally to the feedback input 114 of the PFD 110.

In this embodiment, OTA 140 is used a continuous time, variable current source to charge the loop filter 130 of PLL 100. OTA current (Iota) 148 is a continuous time, variable current. In another embodiment, OTA 140 is a discrete time, variable current source and Iota 148 is a discrete time, variable current. Such a configuration significantly reduces the lock time of PLL 100. For example, PLL lock times are in the order of tens of microseconds. The present embodiment decreases lock time to a couple of microseconds. Iota 148 provided by OTA 140 decreases gradually as lock frequency is approached and, in one embodiment, turns off completely when lock is attained, without additional control circuitry.

OTA 140 may work in parallel with charge pump 120 to provide current to the loop filter 130. The OTA 140 forms a voltage controlled current source that is equal to Gm of the OTA 140.

PLL 100 also includes a voltage controlled oscillator (VCO) 150 having an oscillator input 152 and oscillator output 154. VCO 150 may transmit a feedback signal to PFD 110 in a feedback loop. PFD 110 includes reference input 112 where a reference frequency may be supplied. In one embodiment, an N-divider circuit 160, having an N-divider output 164 and an N-divider input 162, may be operatively coupled in the feedback loop. N-divider circuit 160 reduces the output frequency of a feedback signal from VCO 150 for comparison with a reference frequency at PFD 110. In another embodiment, an N-divider circuit is not present in PLL 100.

Figure 2:
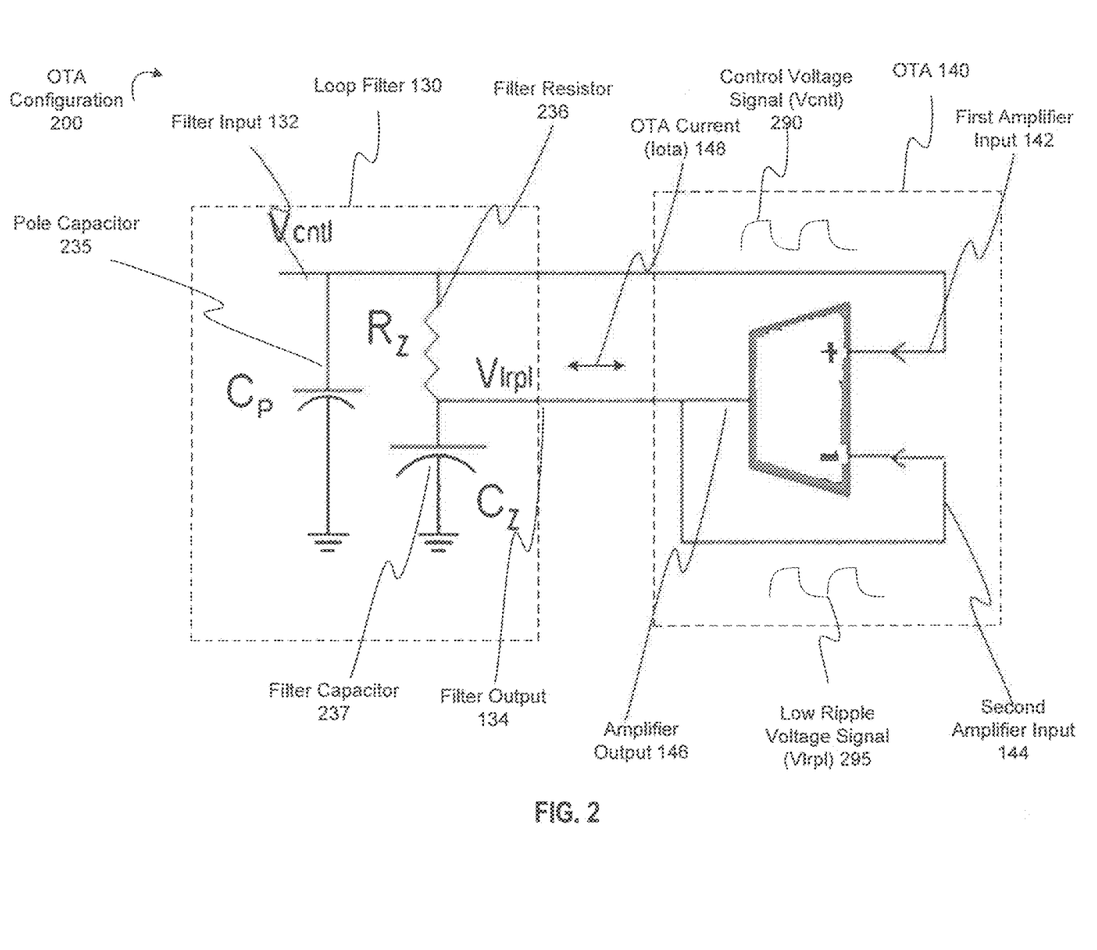
FIG. 2 is a block diagram illustrating one embodiment of an OTA configured with a loop filter.

FIG. 2 is a block diagram illustrating one embodiment of an OTA configured with a loop filter. Loop filter 130 includes pole capacitor 235 and a low pass filter, filter resistor 236 in series with filter capacitor 237. Filter input 132 of loop filter 130 is also connected to the first amplifier input 142 of OTA 140. The amplifier output 146 of OTA 140 is connected to the filter output 134.

In this embodiment, OTA 140 helps charge the loop filter 130 main capacitor, in this case, filter capacitor 237. OTA 140 provides OTA current (Iota) 148, which is a continuous time, variable current. In another embodiment, OTA 140 provides Iota 148 which is a discrete time, variable current. PLL 100 lock time is influenced mainly by the time required to charge filter capacitor 237 of loop filer 130. As filter capacitor 237 is charged to a nominal value, current (Iota 148) from amplifier output 146 decreases down to zero, and therefore does not disturb the stability and phase margin of PLL 100.

In this embodiment, loop filter 130 has two nodes, filter input 132 and filter output 134. Signals, control voltage signal (Vcntl) 290 and low ripple voltage signal (Vlrpl) 295, are coupled to the two nodes, respectively. In one embodiment, low ripple voltage signal (Vlrpl) 295 is the filtered version of control voltage signal 290, e.g., filtered control voltage signal. OTA 140 senses the difference between the control voltage signal 290 and low ripple voltage signal 295 and generates a continuous time, variable current (e.g., Iota 148) to charge or discharge the filter capacitor 237 of loop filter 130. In another embodiment, Iota 148 is a discrete time, variable current. The amplifier output 146 directly charges or discharges filter capacitor 237. The amount of current (e.g., Iota 148) from OTA 140 is linearly dependent on the difference between control voltage signal 290 and low ripple voltage signal 295 as shown in the following equation:

$$I_{ota} = G_m * (V_{cntl} - V_{lrpl}).$$ [Eq. 2]

Gm is the transconductance of OTA 140. In one embodiment, when Vcntl 290 is greater than Vlrpl 295, OTA 140 sources current. When Vcntl 290 is less than Vlrpl 295, OTA 140 sinks current. Iota 148 amplitude depends on the difference between Vcntl 290 and Vlrpl 295.

In one embodiment, OTA 140 can be a traditional dual input folded cascoded amplifier. In another embodiment, OTA 140 can be a rail-to-rail input OTA. In yet other embodiments, OTA 140 can be a pseudo-differential OTA, a pre-amp with positive feedback, a differential pair positive feedback gain enhancement, and a telescopic OTA.

In other embodiments, different filter types may be used. For example, loop filter 130 may be a single capacitor or an RC circuit. Likewise, filter input 132 may be an input and an output, if loop filter 130 is, for example, a single capacitor. In such an example, filter input 132 and filter output 134 would be the same. In another embodiment, an additional loop filter may be used with loop filter 130.

Figure 3:
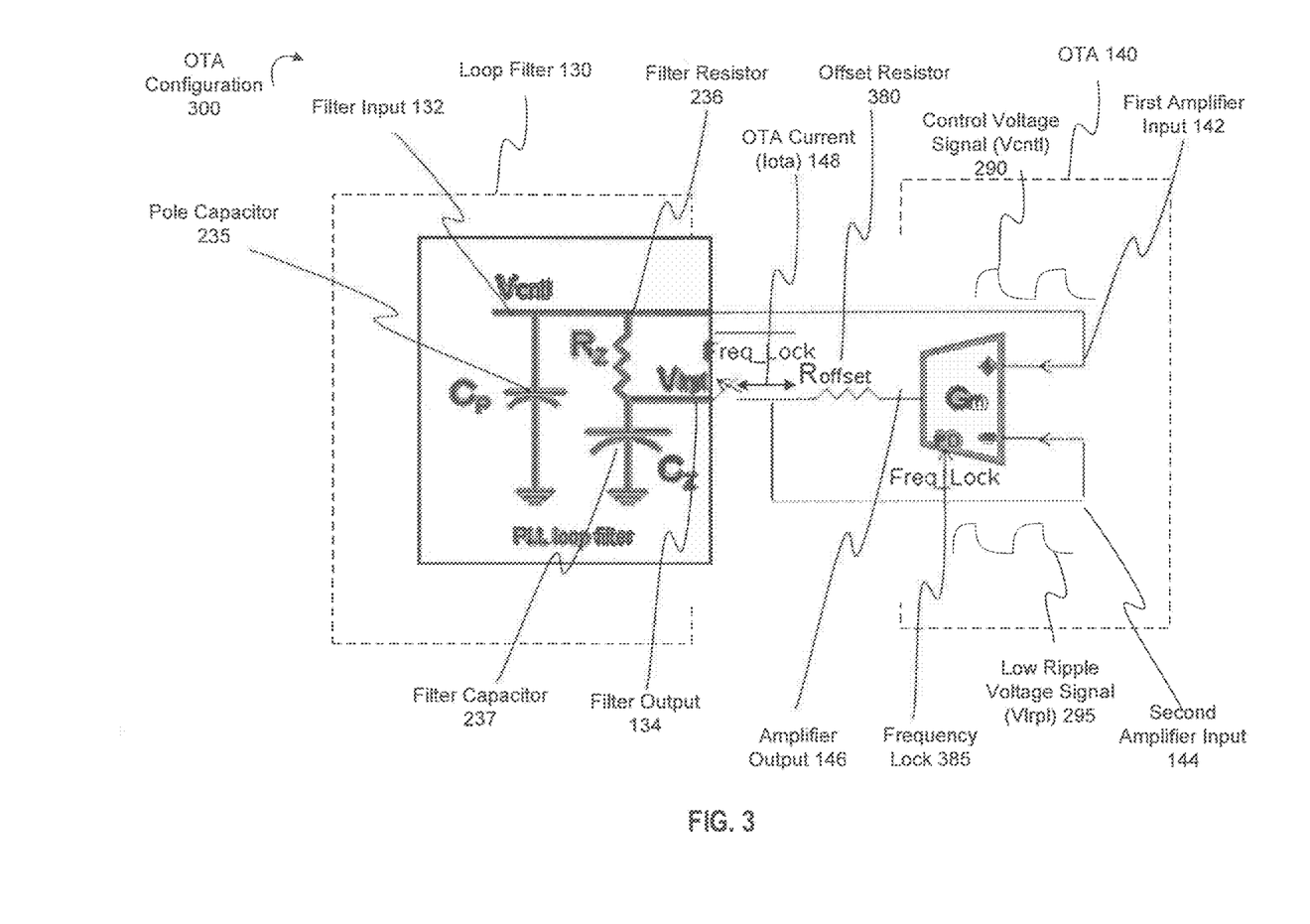
FIG. 3 is a block diagram illustrating one embodiment of an OTA configured with a loop filter.

FIG. 3 is a block diagram illustrating one embodiment of an OTA configured with a loop filter. In one embodiment, offset resistor 380 has a first offset node and a second offset node operatively coupled to loop filter 130 and OTA 140 to reduce the OTA 140 intrinsic offset and gain error. Additionally, OTA 140 may be powered down when PLL 100 attains lock by switching frequency lock 385. OTA 140 provides Iota 148 to loop filter 130.

In another embodiment, OTA 140 may be combined with additional circuitry to reduce lock time in PLL 100.

In another embodiment, PLL 100 containing OTA 140 in configurations described above can cascaded with multiple PLLs 100 to achieve fast lock times.

It should be noted that since OTA 140 is in a closed loop form, the effects of offset and gain error will be limited. For low jitter implementations and to limit the OTA's 140 effect on the PLL 100 phase noise performance, once PLL 100 attains a frequency lock, OTA 140 may be powered down by triggering frequency lock 385. Additionally, a major advantage of the OTA 140 based fast lock scheme is that OTA 140 is independent of the VCO 150, PFD 110 and charge pump 120. Moreover, the OTA 140 does not require additional logic and control circuits and is small in die area and power consumption. When OTA 140 is added to PLL 100 in the configurations submitted above, the implementations do not disturb PLL 100 stability or phase margin and configuration does not affect phase noise or jitter. Additionally, when OTA 140 is added to PLL 100 in the configurations submitted above, lock time of PLL 100 is less correlated to PLL lock frequency than conventional PLLs.

Figure 4:
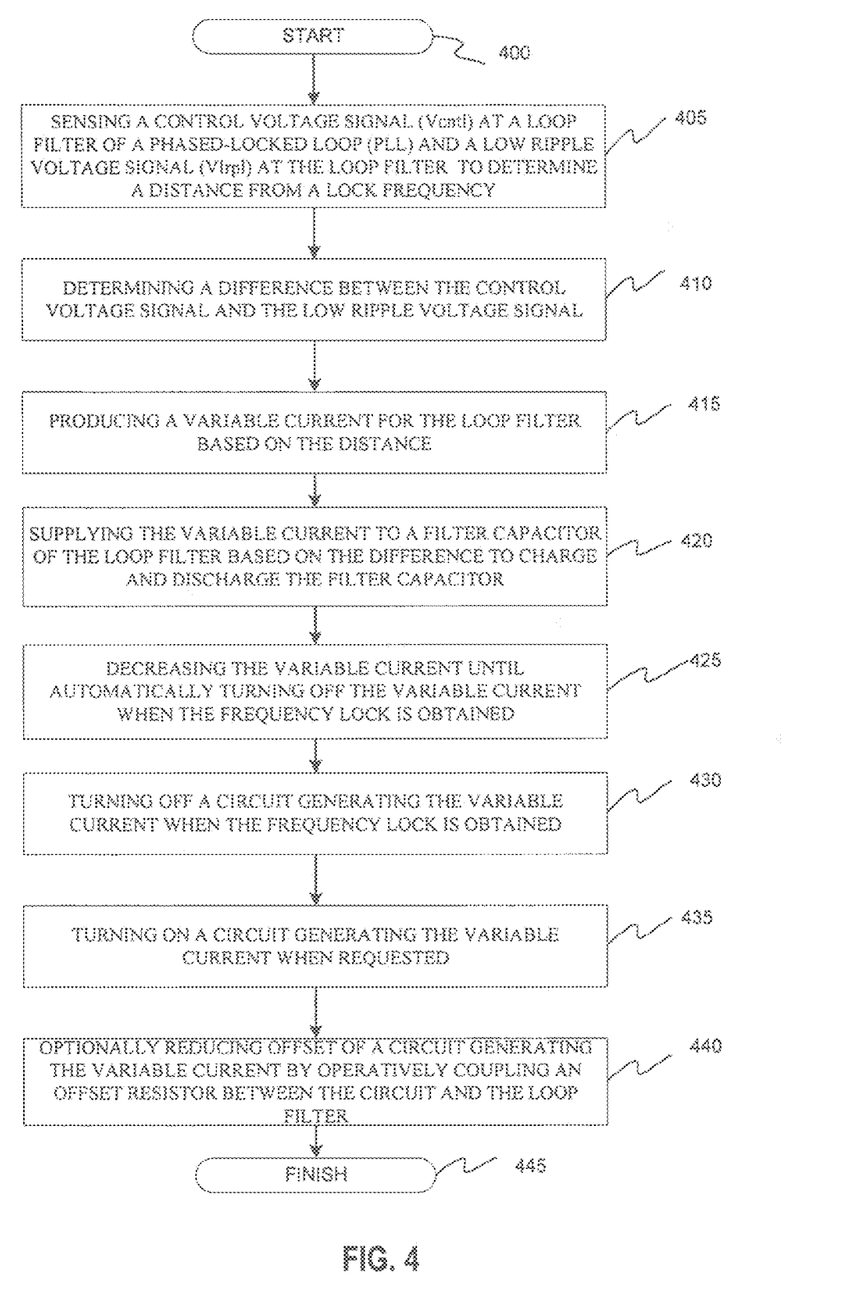
FIG. 4 is a flow diagram illustrating a method of reducing lock time of a PLL, according to one embodiment.

FIG. 4 is a flow diagram illustrating a method of reducing lock time of a PLL, according to one embodiment. Method 400 begins at block 410 where the control voltage signal and a low ripple voltage signal, such as Vcntl 290 and Vlrpl 295, are sensed in order to determine the distance from a lock frequency in a PLL, such as PLL 100. In one embodiment, OTA 140 senses Vcntl 290 and Vlrpl 295. In block 410, the difference between the control voltage signal and a low ripple voltage signal, such as Vcntl 290 and Vlrpl 295, is determined. In one embodiment, OTA 140 determines the difference between Vcntl 290 and Vlrpl 295, which is a measure to determine the distance from the lock frequency of PLL 100. In block 415, a variable current for a loop filter, such as loop filter 130, is produced, based on the distance from the lock frequency. In one embodiment, OTA 140 provides Iota 148, which is a continuous time, variable current. In another embodiment, OTA 140 provides Iota 148, which is a discrete time, variable current. In one embodiment, if the distance from lock is large, the difference between control voltage signal 290 and a low ripple voltage signal 295 is also relatively large, and likewise, the current produced will be large and consistent with Equation 2 above. In block 420, a variable current is supplied to the filter capacitor, such as filter capacitor 237, of a loop filter, such as loop filter 130, based on the difference between a control voltage signal and a low ripple voltage signal, such as Vcntl 290 and Vlrpl 295. In one embodiment, the filter capacitor 237 is either charged or discharged based on the relationship of control voltage signal 290 and low ripple voltage signal 295, per Equation 2 above. It should be noted that the introduction of a continuous time, variable current from, for example, OTA 140, to charge and discharge the filter capacitor 237 significantly speeds up the lock time of PLL 100 without disturbing the stability of PLL 100 and does not affect phase noise, jitter, or performance of PLL 100.

In block 425 of method 400, the variable current decreases until the current automatically turns off when the frequency lock is obtained. In one embodiment, the current produced by OTA 140 is negligible when Vcntl 290 and Vlrpl 295 are approximate, and therefore the current is effectively off. In another embodiment, the current is larger when the difference between Vcntl 290 and Vlrpl 295 is large, and linearly decreases pursuant to Equation 2 as Vcntl 290 and Vlrpl 295 approach one another. It should be noted that implementing a continuous time, variable current source that is not switching, does not introduce the negative effects of a switching solution to reduce lock time on supply noise, stability of PLL 100, and phase margin.

In block 430 of method 400, a circuit generating the variable current is turned off when a frequency lock is obtained. In one embodiment, OTA 140 is powered down when PLL 100 attains lock. When frequency lock is obtained, a lock detection signal may be sent to OTA 140 to power down the circuit. In block 435, a circuit generating the variable current is turned on when requested. In one embodiment, OTA 140 is powered on when a frequency lock of PLL 100 is to be obtained. A signal may be sent to OTA 140 to power up the circuit.

In block 440 of method 400, offset of a circuit generating the variable current is reduced by coupling an offset resistor, such as offset resistor 380, between the circuit and a loop filter, such as loop filter 130. In one embodiment, offset resistor 380 is placed between the amplifier output 146 of OTA 140 and the filter output 134 of the loop filter 130. Offset resistor 380 compensates for the OTA offset.

For simplicity of explanation, the methods are depicted and described as a series of acts. Although the operations of the methods herein are shown and described in a particular order, such order does not mean that such operations are necessarily performed in that order. Operations in accordance with this disclosure can occur in various orders and/or concurrently, and with other acts not presented and described herein. Certain operations may be performed, at least in part, concurrently with other operations and certain operations may be performed in an inverse order to that shown or described.

Figure 5:
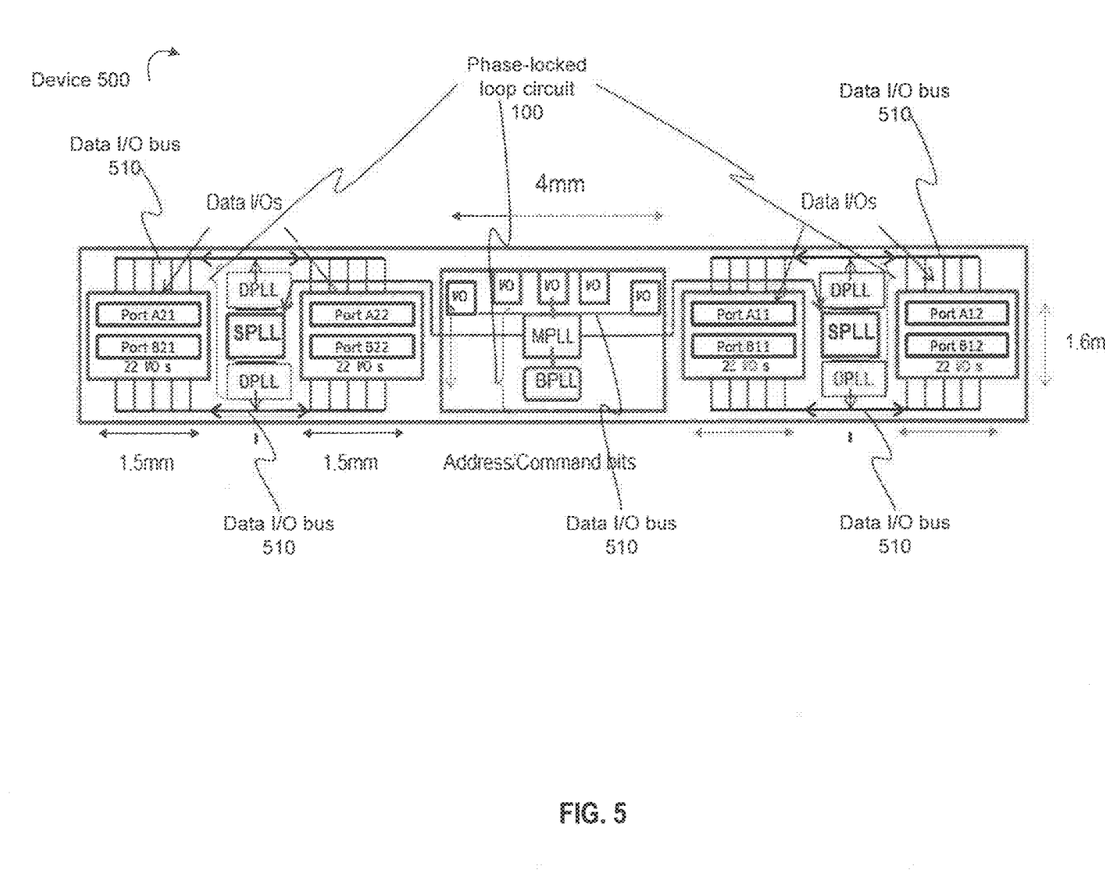
FIG. 5 is a block diagram illustrating a device including multiple PLLs in accordance with one embodiment.

FIG. 5 is a block diagram illustrating a device including multiple PLLs in accordance with one embodiment. In one embodiment, the PLLs 100 implement OTA 140 in one or more of the configurations discussed in FIG. 1, 2, or 3, to reduce lock time in each of the PLLs 100. PLLs 100 are operatively coupled to the data I/O buses 510 of device 500. In one embodiment, a PLL 100 may be implemented on a single data I/O bus. In one embodiment, device 500 is a memory storage device, and PLL 100 may speed up the read and write times of memory storage device. In one embodiment, OTA 140 provides Iota 148 which is a continuous time, variable current. It should be noted that the memory storage device may be for example, SRAM or DRAM. In one embodiment, PLL 100 as described in FIGS. 1, 2, and 3, may be implemented in numerous types of analog PLL devices that may have different forms of loop filters, such as a traditional $2^{nd}$ order loop filter and the filters that use transistor resistance "gm" to replace loop filter resistance "Zr."

In another embodiment, PLL 100 may be implemented in a cascade of PLLs 100 to improve the overall lock time of the device 500.

Device 500 may reside on a common carrier substrate such as, an integrated circuit ("IC") die substrate, a multi-chip module substrate, or the like. Alternatively, the components of device 500 may be one or more separate integrated circuits and/or discrete components. In one exemplary embodiment, device 500 is the QDRIV dual-port SRAM chip, developed by Cypress Semiconductor Corporation, San Jose, Calif. Alternatively, device 500 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "sensing," "determining," "sourcing," "sinking," "producing," "generating," "decreasing," "turning off," "turning on," "receiving," "reducing," "supplying," "transmitting," "generating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

It should also be noted that the OTAs discussed herein in may have other configurations than has been described in alternative embodiments. The design of OTAs is known in the art; accordingly, more detailed descriptions are not provided.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store the one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the above description. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth above are merely exemplary. Particular implementations may vary from these exemplary details and still be contemplated to be within the scope of the present disclosure.

It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. An apparatus comprising:
   a charge pump, comprising a charge pump output;
   a loop filter, comprising a filter input and a filter output, wherein the charge pump output is operatively coupled to the filter input, and wherein the loop filter comprises:
   a filter resistor;
   a filter capacitor coupled in series with the filter resistor; and
   a pole capacitor coupled in parallel with the filter resistor and the filter capacitor; and
   an operational transconductance amplifier (OTA), comprising a first amplifier input, a second amplifier input, and an amplifier output, wherein the first amplifier input is operatively coupled to the filter input and the charge pump output, and the second amplifier input is operatively coupled to the amplifier output and the filter output.

2. The apparatus of claim 1, further comprising:
   an offset resistor, having a first offset node and a second offset node, wherein the first offset node is operatively coupled to the amplifier output and the second offset node is operatively coupled to the second amplifier input and the filter output.

3. The apparatus of claim 1, wherein the OTA is a rail-to-rail input OTA.

4. The apparatus of claim 1, wherein the OTA is folded cascoded amplifier.

5. The apparatus of claim 1, wherein the charge pump, the loop filter, and the OTA are components of a phase-locked loop (PLL).

6. The apparatus of claim 1, further comprising:
   a phase-frequency detector (PFD), comprising a reference input and a feedback input operatively coupled to the charge pump.

7. The apparatus of claim 6, further comprising:
   a voltage controlled oscillator (VCO), comprising an oscillator input and an oscillator output, wherein the oscillator input is operatively coupled to the first amplifier input, the filter input, and the charge pump output, and the oscillator output is operatively coupled to the feedback input of the PFD.

8. The apparatus of claim 7, further comprising:
   an N-divider circuit, comprising an N-divider input and an N-divider output, wherein the N-divider input is operatively coupled to the oscillator output of the VCO and the N-divider output is operatively coupled to the feedback input of the PFD.

9. A device comprising:
   a phase-locked loop (PLL) comprising;
     a charge pump, comprising a charge pump output;
     a loop filter, comprising a filter input and a filter output, wherein the charge pump output is operatively coupled with the filter input, and wherein the loop filter comprises:
     a filter resistor;
     a filter capacitor coupled in series with the filter resistor; and
     a pole capacitor coupled in parallel with the filter resistor and the filter capacitor; and
     an operational transconductance amplifier (OTA), comprising a first amplifier input, a second amplifier input, and an amplifier output, wherein the first amplifier input is operatively coupled to the filter input and the charge pump output, and the second amplifier input is operatively coupled to the amplifier output and filter output; and
   a data I/O bus, operatively coupled to the PLL.

10. The device of claim 9, further comprising:
    an offset resistor, operatively coupled to the OTA, to reduce an offset of the OTA.

* * * * *